United States Patent
Kim et al.

(10) Patent No.: US 8,219,893 B2
(45) Date of Patent: *Jul. 10, 2012

(54) HIGH-SPEED COMMUNICATION CHANNEL TECHNIQUES WITH IMPROVED ROBUSTNESS TO TIMING UNCERTAINTY

(75) Inventors: Andrew Joo Kim, Atlanta, GA (US); Stephen E. Ralph, Atlanta, GA (US); Sanjay Bajekal, Marietta, GA (US)

(73) Assignee: Quellan, Inc., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/074,804

(22) Filed: Mar. 29, 2011

(65) Prior Publication Data

US 2011/0222635 A1     Sep. 15, 2011

Related U.S. Application Data

(63) Continuation of application No. 10/706,187, filed on Nov. 12, 2003, now Pat. No. 7,934,144.

(60) Provisional application No. 60/425,985, filed on Nov. 12, 2002.

(51) Int. Cl.
*H03M 13/00* (2006.01)
(52) U.S. Cl. .......................... 714/780; 375/317; 375/341
(58) Field of Classification Search .................. 714/780; 375/317, 341
See application file for complete search history.

(56) References Cited

U.S. PATENT DOCUMENTS 6,480,552 B1 * 11/2002 Tonello .......................... 375/265

* cited by examiner

*Primary Examiner* — Sam Rizk
(74) *Attorney, Agent, or Firm* — King & Spalding (57) ABSTRACT

A method and system using the principle of generalized maximum likelihood estimation to resolve sample timing uncertainties that are associated with the decoding of communication signals. By using generalized maximum likelihood estimation, sample timing uncertainty can be resolved by taking multiple samples of the received signal within a symbol period and determining which sample best corresponds to the optimal sample timing. The sample which best corresponds to the optimal sample timing can be determined from a timing index which can be calculated from ambiguity indicators that are based on the samples of the received signal.

23 Claims, 4 Drawing Sheets

FIG. 10

HIGH-SPEED COMMUNICATION CHANNEL TECHNIQUES WITH IMPROVED ROBUSTNESS TO TIMING UNCERTAINTY

STATEMENT REGARDING RELATED APPLICATION

This application is a continuation of and claims priority to application Ser. No. 10/706,187, filed Nov. 12, 2003, U.S. Pat. No. 7,934,144, entitled "High-Speed Analog-to-Digital Conversion with Improved Robustness to Timing Uncertainty," which claims priority to provisional patent application entitled, "High-Speed Analog-to-Digital Conversion with Improved Robustness to Timing Uncertainty," filed on Nov. 12, 2002 and assigned U.S. Application Ser. No. 60/425,985. The entire contents of each of the foregoing priority applications are hereby fully incorporated herein by reference.

TECHNICAL FIELD

This invention relates to the receiver of a communications system, and more particularly, to a receiver for decoding or detecting discrete signal levels from an analog or digital waveform containing data.

BACKGROUND OF THE INVENTION

Figure 1:
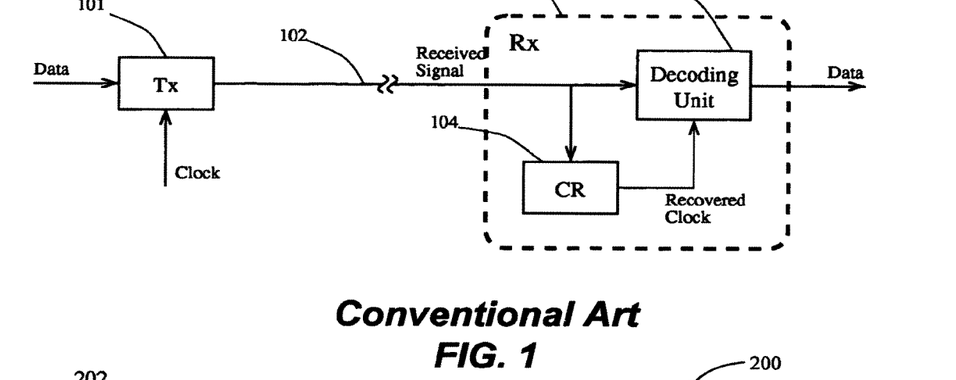
FIG. 1 is a block diagram of a conventional communications system.

Digital communication involves the generation and reception of analog waveforms to convey digital data as illustrated in FIG. 1. The transmitter 101 takes as input a sequence of data and converts it into an analog waveform. The waveform is transmitted over a medium or channel 102 to a receiver 103, which decodes the original data from the received waveform.

The transmitter 101 generating the waveform sets the signal amplitude, phase, and/or frequency to one of N discrete values to represent digital information where N is the specified number of signal levels. This level or symbol is transmitted for a predetermined time period called the symbol period and denoted as $T_0$. A symbol is transmitted once every symbol period. In particular, a clock signal with period $T_0$ is used to determine when to send a new symbol. In this fashion, the transmitter conveys digital data as a sequence of symbols to a receiver 103. An exemplary binary on-off keyed waveform 200 is illustrated in FIG. 2 to illustrate some of the attributes of an exemplary communication signal that can comprise a multilevel signal, and in this case, a binary form of a multilevel signal.

Figure 2:
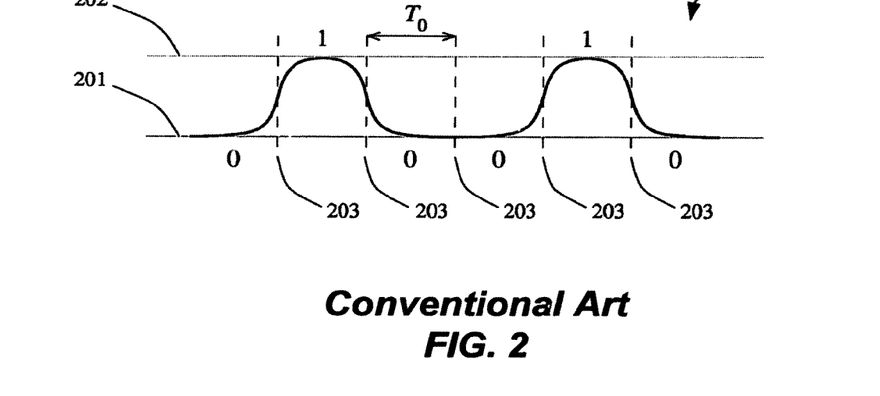
FIG. 2 is an exemplary binary on-off keyed signal with demarcations to indicate different symbols that can form an exemplary multilevel signal.

In FIG. 2, one of two discrete amplitude values (201, 202) is transmitted every symbol period $T_0$ to convey a bit of information (i.e. a binary '0' or '1'). The demarcations 203 illustrate the division from one symbol to another. When the symbol level changes, the demarcation is termed a signal "edge" or "transition".

The task of a receiver 103 is to decode the digital information (i.e. detect which of the N levels was transmitted) from the communicated analog waveform 200. During transmission, the communicated signal can be degraded. In particular, it can be distorted by the transmission channel resulting in what is known as intersymbol interference (ISI) and corrupted by noise or interference from external sources. The distortion and noise can lead to decoding errors. It is a goal of receiver design to minimize the frequency of these errors.

Consistent with the transmitter 101, the receiver 103 decodes one symbol every symbol period. Similar to the transmitter 101, a clock signal is used to mark the precise time at which to decode a symbol. This clock signal may be obtained from the same clock (not shown) used to drive the transmitter, but it is more often the case that the clock signal is reconstructed from the communicated waveform 200 in a process known as clock-recovery (CR) as depicted in FIG. 1.

Ideally, the recovered clock signal would be an exact replica of the clock used at the transmitter 101. In particular, it would be a periodic signal with period $T_0$. Furthermore, the timing of each sample would ideally convey a maximum amount of information about the corresponding originally transmitted symbol. Unfortunately, in many instances, this is not the case. In particular, the recovered clock signal can exhibit jitter, which is the presence of erratic perturbations of the sample timing which can result in suboptimal decoding.

When jitter is present in the clock signal, instead of decoding a symbol exactly once every symbol period, a symbol is usually decoded only approximately once every symbol period. In other words, sometimes the samples are drawn faster than once every $T_0$ (i.e. drawn too early), and sometimes the samples are drawn slower than once every $T_0$ (i.e. drawn too late), but on the average, they are usually drawn every $T_0$. These timing deviations result in decoding samples closer to the signal edges thereby increasing the chance of decoding errors.

In addition to problems introduced by jitter, decoding at the "right time" is problematic because there might not exist a single periodic time instance, which captures all the available information about the transmitted symbol in the waveform. In particular, even in the optimistic case of having a perfect clock signal at the receiver 103, the clock signal may not provide the best sampling times. These less ideal sampling times can arise due to distortion of the transmitted signal.

For example, in optical communications, it is well known that the chirp distortion on an optical signal can skew the optimal sampling point in a data-dependent fashion. Specifically, the propagation delay for a large amplitude pulse is different than that for a small amplitude pulse. This delay difference can result in (i) an eye-diagram that appears "tilted" and (ii) different optimal sampling points for the different data values.

Figure 3:
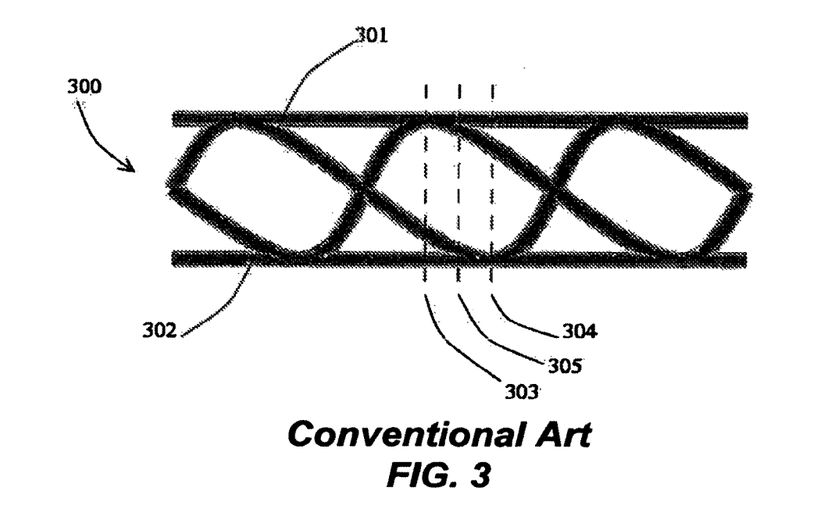
FIG. 3 is an illustration of an exemplary eye-diagram of a binary optical signal suffering from chirp distortion with exemplary sample timing points.

The problem associated with such a delay difference is illustrated in FIG. 3. FIG. 3 illustrates an eye-diagram 300 of a received optical signal distorted by chirp that can be produced by a direct-modulation laser. Chirp can delay the large amplitude portions 301 of the signal by a larger amount than the small amplitude portions 302 of the signal.

A received signal is usually sampled where the signal is maximally flat and is at one of the amplitude extremes such as at a first time 303 for the large amplitude signal portions and at a second time 304 for the small amplitude signal portions since it is at these points where one has the least likelihood of having a decoding error. Consequently, the optimum sampling time depends on the underlying symbol value and must therefore change on a symbol-by-symbol basis. However, conventional systems use a data-independent sampling point, such as a third time 305 which happens in this case to fall between the first time 303 and the second time 304. The use of such a data-independent sampling time is less than optimal as it does not sample at the amplitude extremes for either the large or small amplitude portions.

As another example, in high-speed communications, the transmission channel often distorts the waveform resulting in what is called dispersion where the signal data characteristic (e.g. amplitude) for one symbol bleeds over into adjacent symbols. It is common practice to counteract this distortion with equalization. Equalization is a "distortion" that is the inverse of the channel response. Unfortunately, it is usually impractical to exactly equalize away all of the channel distortion. The residual distortion can manifest itself as intersymbol interference (ISI) where the received amplitude of one symbol is affected by the transmitted amplitude of surrounding symbols rather than just the current symbol, as is the ideal case.

This ISI can cause two significant problems. Firstly, the ISI can shift the optimal sampling time from the center of the symbol period and have the amount of the shift being dependent on the preceding and succeeding data symbol values. This shift is data-dependent and thus changes on a symbol-by-symbol basis.

Secondly, ISI can temporally shift the symbol transition or edges locations. These shifts can lead to data-dependent jitter (DDJ) in the clock recovery (CR) unit 104 thereby increasing the jitter in the reconstructed clock signal used to drive the decoding unit 105 in the receiver 103.

The problems described above can limit the performance of signal decoding. In particular, the loss of information associated with scalar sampling (i.e. decoding using only a single sample per symbol period) in the presence of timing uncertainty (such as jitter or data-dependent optimal sample times) results in too many decoding errors. Some conventional methods address a few aspects of the jitter problems associated with scalar sampling but they do not solve these problems completely. Many conventional methods and systems attempt to reconstruct the transmitter clock signal at the receiver 103. In particular, those clock recovery (CR) methods are designed to minimize sampling jitter and produce a sampling clock signal with as constant a symbol period as possible. Towards this end, conventional methods and systems attempt to determine an optimal sampling phase by temporally shifting the clock signal so that the receiver 103 periodically samples in an appropriate location.

Conventional methods and systems for temporally shifting the clock signal are usually distinguishable from one another in the manner in which they arrive at such a phase offset. These conventional methods and systems usually attempt to find a single constant or slowly-varying phase value by keeping the variability of the time between sampling points to a minimum. In particular, conventional methods and systems assume the existence of an underlying periodic optimal sample time and they often ignore the fact that the optimal sample time may vary in a data-dependent fashion (and in particular with each symbol) as described above.

While some conventional methods and systems for decoding received signals recognize the need for symbol-by-symbol adjustment of the sampling point, these conventional methods and systems oversample the signal such as regularly sampling the received signal several times within a symbol period and outputting one of the decoded oversampled values as the decoded symbol. These methods and systems can differ by how they determine which of the plurality of decoded oversampled values to output. All of these methods and systems, however, rely on the signal edges to select the oversampled value. For example, some methods and systems output the decoded oversampled value as soon as a predetermined number of decoded values produce an identical value. Such an approach is effectively taking the decoded sample as soon as a valid pulse is detected (as indicated by the consecutive decoded values). This approach has a drawback in that the predetermined number of consecutive decoded values may not be achieved in a symbol period due to signal distortion and noise. In this case, the indicator for adjusting the sample location is absent and therefore cannot guide the decoding process, and it effectively operates in a blind mode of operation. This drawback is the result of an inherent assumption of the method that amplitude distortions are relatively insignificant and sample timing uncertainty is the only factor affecting decoding performance. However, in many communications systems (especially in high-speed systems), it is both sample timing uncertainty and amplitude distortion that causes decoding errors.

Other conventional methods and systems use a sample time that adjusts on a symbol-by-symbol basis. In particular, using the oversampled received signal, the preceding and succeeding edges for each symbol can be detected and the sample time can be taken as the midpoint between the two edges. Thus, this conventional method takes the temporal midpoint of the symbol as the sample time. While very intuitive, this conventional method assumes the received pulses are symmetric in time. In general, this is not the case as many communications channels introduce distortions (such as phase distortions), which can skew the received pulse and result in a sample location that is not in the temporal center of the symbol.

Most conventional methods and systems for decoding received signals propose techniques and hardware that are of considerably complexity especially if the techniques and hardware are considered for high-speed communications systems. Because of their complexity, these conventional techniques and hardware push the speed limitations of integrated circuit (IC) technology. At the time of this writing, high speed communications are moving at speeds on the order of tens of gigabits per second (Gbps).

The oversampling in conventional methods and systems is impractical at these high data speeds because the technology does not exist to build the required high-resolution analog-to-digital converters (ADCs) that sample at these rates let alone the multiples of these rates required for oversampling. Furthermore, the conventional methods and systems often require microprocessors or complex state machines that can process the data at these high data rates.

Microprocessors operating on the order of 100 GHz or more do not exist as of this writing, and it is of extreme difficulty to build the logic that operates at tens of Gigahertz. Additionally, even if the speeds involved were not prohibitive because of advances in IC technology over time, a method requiring less complex and sophisticated circuitry could cost less to implement, and consequently, provide an economic advantage.

Thus, there is a need in the art for a simple method and system for achieving a robust decoding process that can resolve timing uncertainties due to phenomena such as signal distortion, noise, and timing jitter. There is also a need in art for a receiver sampling method and system that adjusts to sample timing on a symbol-by-symbol basis to account for a data-dependent optimal sampling point. Further, there is a need in the art for a decoding method and system that adjusts for optimal sample timing variations in the presence of considerable amplitude distortions and noise. Additionally, there is a need in the art for a method and system that adjusts for optimal sample timing variations where the received pulses are not necessary symmetric. There is also a need in the art a low-complexity solution that can be implemented in an economically practical fashion.

SUMMARY OF THE INVENTION

The present invention includes a method and system that can resolve sample timing uncertainties that can occur during signal decoding by using the principle of generalized maximum likelihood estimation. Timing uncertainties in decoding received signals can be caused by clock jitter in the receiver, signal noise, or signal distortion, or any combination thereof.

While timing uncertainty can vary on a symbol-by-symbol basis, such timing uncertainty can be resolved with the present invention.

By applying the principle of generalized maximum likelihood estimation, the problem of timing uncertainty can be resolved by taking multiple samples of the received signal within a symbol period and determining which sample best corresponds to an optimal sample timing using simple analog processing and digital logic. The sample which best corresponds to an optimal sample timing can be determined from a timing index. The timing index can correspond to a nuisance parameter of an equation that embodies the principle generalized maximum likelihood estimation. The timing index can be calculated from ambiguity indicators that are based on the samples of the received signal.

The ambiguity indicators can generally correspond to a confidence level as to whether a preliminary decoded value is likely to be equal to the original transmitted value. Unlike the prior art which ignores timing uncertainty and thus the nuisance parameter, the present invention can include the nuisance parameter as factor in the decoding process.

According to one exemplary aspect, the present invention can include a plurality of soft-decoders. Each soft-decoder can sample the received signal at a different time within a symbol period and output two values. Each first value can comprise a preliminary decoded value while each second value can comprise an ambiguity indicator. Coupled to each soft-decoder can be a logic device that can determine a decoded value based on the one or more preliminary decoded values and ambiguity indicators.

According to another exemplary aspect, the present invention can include an analog-to-digital converter for sampling the received signal faster than once every single symbol period of the original signal. The converter can be coupled to a processor that can group a subset of sampled values derived from the single symbol period. The processor can also examine the subset of values and it can determine a value closest to an optimum sampling time based on the principle of generalized maximum likelihood estimation. The processor can then decode a value closest to the optimum sampling time and output that value as the decoded symbol.

DETAILED DESCRIPTION OF EXEMPLARY EMBODIMENTS OF THE INVENTION

A method and system can resolve sample timing uncertainties that occur during received signal decoding by using the principle of generalized maximum likelihood estimation. By using generalized maximum likelihood estimation, timing uncertainty can be resolved by taking multiple samples of the received signal within a symbol period and determining which sample best corresponds to an optimal sample timing. The sample which best corresponds to an optimal sample timing can be determined from a timing index. The timing index can be calculated from ambiguity indicators that are based on the samples of the received signal.

The ambiguity indicators can correspond to a confidence level as to whether a preliminary decoded value is likely to be equal to the originally transmitted value. The ambiguity indicators can also correspond to a nuisance parameter of an equation based on the principle of generalized maximum likelihood estimation.

While the present invention is described in connection with a two-level (binary) signal where the information is encoded in the signal amplitude, the present invention is applicable to digital or analog signals comprising two or more levels where the information is encoded in one or more of the signal amplitude, phase, and frequency.

A multilevel signal can allow for more than one bit to be transmitted per clock cycle, thereby improving the efficiency of the transmitted signal. For multilevel transmissions, some characteristic (i.e., signal property) of a transmitted pulse (such as amplitude, phase, frequency, etc.) can be modulated over $2^n$ levels in order to encode n bits into the single pulse, thereby improving the efficiency of the transmitted pulse. Multilevel modulation can increase aggregate channel throughput by combining n on-off keying (OOK) data streams (each with bit rate, B, in bits/s) into one $2^n$-level signal (with a symbol rate, B, in symbols/s) for an aggregate throughput (in bits/s) that is n times greater than B.

For example, an aggregate data rate of a sixteen-level signal can be four times greater than a corresponding OOK signal with a bit rate equal to the multilevel symbol rate. As the simplest case, OOK can be regarded as a two level multilevel signal where the symbol rate and bit rate are equal.

As discussed above, the present invention can use multiple samples from the same symbol period of a received signal to decode each symbol communicated in the waveform. The use of more than one sample exploits the temporal variations and can provide robustness in calculating timing uncertainties caused by jitter and data-dependent skew.

Conventional scalar sampling is based on the principle of maximum likelihood (ML) decoding. In particular, a received waveform $x(t)$ is sampled every $T_0$ seconds where $T_0$ is the symbol period of communications link. The sample $x(kT_0)$ (for integers k) is then decoded by comparison against a threshold for a binary system (or a set of thresholds for a multilevel communications system). Specifically, the ML decoding rule for the $k^{th}$ symbol is given as $$d^{(k)} = \operatorname*{argmax}_{s^{(k)}}\{p(x(kT_0)|s^{(k)})\} \quad (1)$$

where $s^{(k)}$ represents a candidate transmitted symbol value, $d^{(k)}$ represents the $k^{th}$ decoded symbol, and $p(x(kT_0)|s^{(k)})$ represents the probability of receiving value $x(kT_0)$ conditioned on the event that $s^{(k)}$ was the $k^{th}$ symbol transmitted. The entity $p(x(kT_0)|s^{(k)})$ is widely termed a "likelihood", as in "the likelihood that $x(kT_0)$ is observed given that $s^{(k)}$ is transmitted". As its name implies, the ML approach chooses the value of $s^{(k)}$ which maximizes the likelihood of the received value. It is known to those skilled in the art that ML decoding is optimal in the sense that it minimizes the number of decoding errors for equally like transmitted symbols.

The current invention is based on the principle of generalized maximum likelihood (GML) decoding. The optimality of the ML rule in Eq. (1) is conditioned on the fact that the lone sample $x(kT_0)$ captures all the information regarding the datum $s^{(k)}$ from the waveform $x(t)$, i.e. the decoding cannot be improved by using another or additional samples. But, as described earlier, this is not the case in general. For one, samples are not drawn exactly every $T_0$ seconds (i.e. at $t=kT_0$) due to timing jitter. In particular, jitter perturbs the sample timing by an unknown value. Letting $\epsilon^{(k)}$ denote the unknown timing perturbation for the $k^{th}$ symbol, the received waveform is sampled at time $t=kT_0+\epsilon^{(k)}$ rather than $t=kT_0$.

In addition to the timing uncertainty caused by jitter, it may not be optimal to sample at the same point within each symbol period due to the effects of channel distortion such as ISI and chirp. These distortions change the optimal sampling time from $t=kT_0$ to $t=kT_0+\sigma^{(k)}$ where $\sigma^{(k)}$ is a data-dependent quantity and varies on a symbol-by-symbol basis.

Considering these effects together, we note that while the optimal sampling time is $t=kT_0+\sigma^{(k)}$ for sample k, the decoding unit is only provided with the jitter-corrupted clock timings $t'=kT_0+\epsilon^{(k)}$. Thus, it is desired to sample at time $t=kT_0+\sigma^{(k)}=t'-\epsilon^{(k)}+\sigma^{(k)}$. For notational simplicity, this can be rewritten as $t=t'+\tau^{(k)}$ where $\tau^{(k)}$ captures all the symbol-by-symbol timing uncertainty (caused by both jitter and signal distortion) for the $k^{th}$ symbol. If we ignore the presence of $\tau^{(k)}$, as is conventionally done, we would not be fully utilizing the information in the signal. However, the present invention follows the GML concept in estimating both the nuisance parameter $\tau^{(k)}$ and the parameter of interest $s^{(k)}$, but it reports only the estimate of $s^{(k)}$ (i.e. the decoded symbol) as $\tau^{(k)}$ is only used to improve the estimate $s^{(k)}$ by accounting for timing uncertainty. In particular, the present invention attempts to solve the problem defined by Equation (2):

$$d^{(k)} = \operatorname*{argmax}_{s^{(k)}}\{\max_{\tau^{(k)}} p(x(t'+\tau^{(k)})|s^{(k)},\tau^{(k)})\}. \quad (2)$$

While firmly principled, solving Eq. (2) is difficult in high-speed analog electronics. In particular, not only would it involve the analysis of the signal at a variety of time samples, but it would also involve the selection of the maximum likelihood timing adjustment $\tau^{(k)}$ and this operation would have to be performed at the symbol communication speed. To bypass these implementation difficulties, several practical and exemplary embodiments of the invention are described which approximate the GML rule in Eq. (2) with a simple combination of analog and digital hardware. To simplify the notation slightly, the superscript (k) on d, s, and $\tau$ will be omitted as it will be understood that we are always decoding the current symbol.

For ease of presentation, these embodiments will be presented for the binary signaling case. However, those skilled in the art will recognize that the extension to signals with more than two levels is straightforward. Such extensions to signals with more than two levels are understood to be included as exemplary embodiments of the present invention. Furthermore, the exemplary embodiments are described using three versions of the signal differing only by their delays. Those skilled in the art will recognize that extending the described methodology to include more than three delays is not beyond the scope of the present invention and can offer additional robustness to timing uncertainties. Such extensions are inherently included as part of exemplary embodiments described below.

First Exemplary Embodiment

Figure 4:
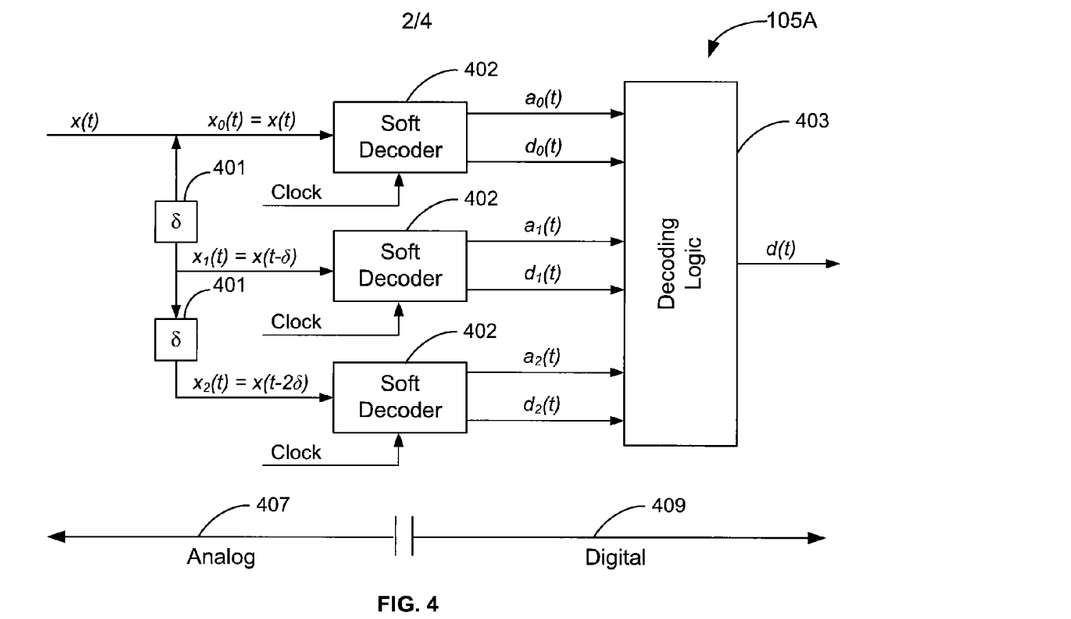
FIG. 4 is functional block diagram of a decoding unit according to one exemplary embodiment of the present invention.
Figure 5:
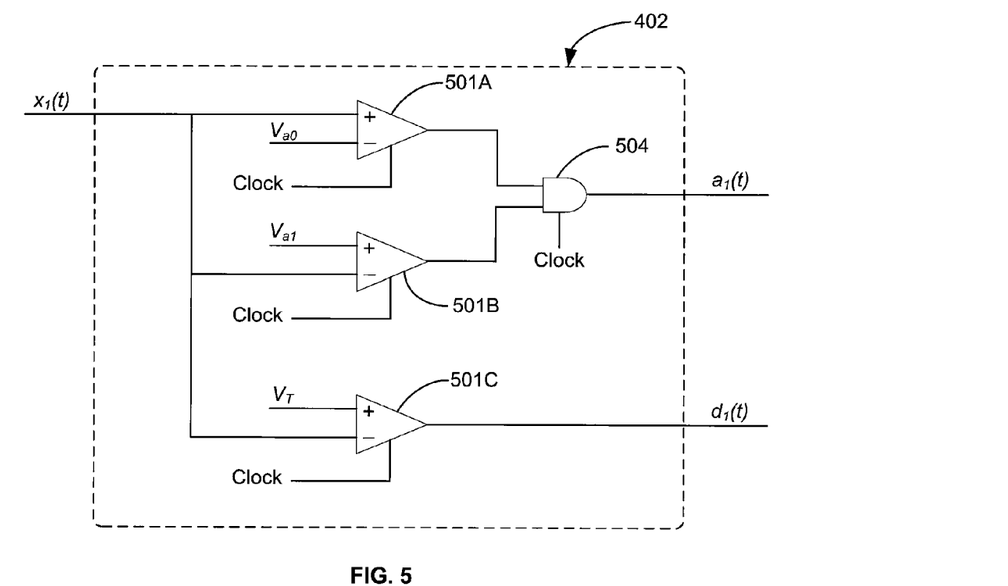
FIG. 5 is a block diagram of a soft-decoder according to one exemplary embodiment of the present invention.

Referring again now to the drawings, in which like numerals represent like elements throughout the several Figures, aspects of the present invention and the illustrative operating environment will be described. FIGS. 4 and 5 illustrate one exemplary decoding unit 105A of the current invention. In these figures, analog processing modules such as modules that usually allow a continuum of signal levels and do not operate according to a clock signal are described. Further, digital processing modules such as modules that may force the signal level to the discrete digital levels and operate on a clocked basis are also described. Additionally, modules incorporating aspects of both analog and digital functionality are also described.

At the bottom of FIG. 4, two arrows 407, 409 show how the signals and modules are partitioned into the analog and digital domains. Signals on the left-side of the figure over the "Analog" left arrow 407 are analog in nature. While these signals originated from a digital source, they may have been distorted by the transmission channel and noise. The modules in this "Analog" section cannot assume that the input signal only has one of the predetermined digital levels as doing so may further distort the signal. Signals on the right-side of the figure over the "Digital" right arrow 409 are digital in nature. This occurs after the soft-decoder 402 and the signals at this point are all well-formed signals. Thus, modules in this domain may take advantage of the digital nature of the signal for simpler implementation of the defined functionality.

FIG. 4 illustrates a functional block diagram giving an overview of one exemplary embodiment of a decoding unit 105A. In FIG. 4, the received signal $x(t)$ is split off and fed through several analog delay stages or elements 401 of delay $\delta$ to produce three delayed versions of the signal: $x_0(t)=x(t)$, $x_1(t)=(t-\delta)$, and $x_2(t)=x(t-2\delta)$. The delay $\delta$ is assumed to be small relative to the symbol period $T_0$, but in some circumstances, may be as large as $T_0/2$. Note that the input clock and $x(t)$ are assumed to be synchronized such that $t-\delta$ nominally (i.e. without timing uncertainty) corresponds to the conventional sampling point $kT_0$. For instance, $x(t-\delta)$ can be considered the middle of the symbol pulse. If the input clock and $x(t)$ are not appropriately synchronized, then this timing bias can produce additional timing uncertainty for which the present invention can also correct.

However, correcting for this timing error bias may detract from the present invention's ability to correct other sources of timing uncertainty. Because the timing error bias can be resolved with conventional methods, it can advantageous in some exemplary embodiments to use conventional methods in order to allow the present invention to have as much corrective capacity as possible to adjust for the more complex timing uncertainties that vary on a symbol-by-symbol basis.

Each of the signals $x_i(t)$ is fed into identical soft-decoders 402 which provide a preliminary decoding of the signal. In Contrast to soft-decoders 402, a conventional hard-decoder is a device which makes a "hard" decision on the symbol value, e.g. a '0' or '1' in binary settings. A soft-decoder 402, on the other hand, makes a tentative decision. Instead of only declaring the decoded value, it also conveys a level of confidence that the decoded value is correct. In binary communications, for example, a soft-decoder 402 may output one or more of the following:

'0' to signify strong confidence in its choice that the symbol is a '0',
'0?' to signify that the symbol is most likely to be a '0' but there is a nontrivial probability that it may be a '1',
'1?' to signify that the symbol is most likely to be a '1' but there is a nontrivial probability that it may be a '0', and
'1' to signify strong confidence in its choice that the symbol is a '1'.

The outputs of the soft-decoders 402 mentioned above are not limited to the pair of binary symbols (the integer with a question mark or space) discussed above. The outputs mentioned above represent four different characterizations of confidence levels. Those skilled in the art will appreciate that fewer or more characterizations using different symbols for the characterizations are not beyond the scope and spirit of the present invention.

The soft-decoder 402 used in the present invention operates in this manner. Specifically, given analog input $x_i(t)$, the soft-decoder outputs two signals $a_i(t)$ and $d_i(t)$. The signal $d_i(t)$ is a hard binary characterization of $x_i(t)$, i.e. a '0' or '1'. For example, $d_i(t)$ can be the ML decoded value of $x_i(t)$, or more generally, $d_i(t)$ can be $x_i(t)$ compared to some decision threshold. The signal $a_i(t)$ is a binary ambiguity indicator signifying whether or not the soft-decoder is confident in its decision $d_i(t)$, i.e. $a_i(t)$ conveys whether or not $d_i(t)$ is highly probable to correctly represent the current symbol. In the above described output of an exemplary soft-decoder, the ambiguity indicator can corresponds on whether or not there should be a '?' associated with the hard decoded value $d_i(t)$. It is apparent to those skilled in the art that just as the decision $d_i(t)$ can take on more than two levels for multilevel contexts, the ambiguity indicator $a_i(t)$ can take on more than two levels (regardless of whether the signal comprises two or more levels) to allow more degrees of confidence in the decision $d_i(t)$ to be conveyed.

An exemplary soft-decoder 402 is illustrated in FIG. 5. In this figure, the analog input $x_i(t)$ is fed to three comparators 501A-501C with associated thresholds $V_{a0}$, $V_T$, and $V_{a1}$ which satisfy $V_{a0} < V_T < V_{a1}$. The bottom-most comparator 501C in the figure compares $x_i(t)$ to the decision threshold $V_T$ which yields a hard-decoded output $d_i(t)$ for $x_i(t)$. When the threshold $V_T$ is appropriately set, this hard-decoded output $d_i(t)$ corresponds to ML decoding on $x_i(t)$.

The first pair of comparators 501A and 501B in FIG. 5 threshold $x_i(t)$ against reference levels $V_{a0}$ and $V_{a1}$. The outputs of the first two comparators 501A and 501B are fed into a logical binary element 504 such as logical AND gate. The voltages $V_{a0}$ and $V_{a1}$ define what is referred to as the ambiguity range. If a received value falls within this ambiguity range, then the value is said to be ambiguous because the sample value is close to the decision threshold $V_T$. When $x_i(t)$ falls within the ambiguity range $V_{a0} < x_i(t) < V_{a1}$, both comparator outputs are true and the ambiguity indicator $a_i(t)$ is thus set to true. If $x_i(t)$ is not, in the ambiguity range, one of the comparator outputs is false, and thus the ambiguity indicator is false, i.e. the decoded result is not "ambiguous".

The soft-decoder outputs $a_i(t)$ and $d_i(t)$ are fed to a decoding logic device 403 as illustrated in FIG. 4. This decoding logic device 403 uses the preliminary decoded values $d_i(t)$ and their associated ambiguity indicators $a_i(t)$ to approximate the GML rule. Specifically, the logic device 403 is designed so that the signals $a_i(t)$ and $d_i(t)$ are used to determine which sample timing index i corresponds to the optimal sampling point in time, which is the value of $\tau^{(k)}$ in Eq. (2). Given the timing offset estimate, the GML approach would output the ML estimate for this sample point. Thus, the present invention outputs the hard-decoded value $d_i(t)$ for the chosen timing index i.

An exemplary decoding rule designed to reduce the impact of timing uncertainty is given in Table 1. The first column simply labels the row number for future reference. The next three columns are possible values that the triplet of ambiguity signals can possess. The fifth column is the inferred optimal sample timing index. The sixth column is the hard-decoded output symbol. To keep the table manageable in size, the fifth and sixth columns are stated in terms of the hard-decoded values $d_i(t)$. An exhaustive listing of the $a_i(t)$ and $d_i(t)$ input combinations would yield a table with 64 rows.

TABLE 1

Decoding logic device output rule.

| row | $a_0$ | $a_1$ | $a_2$ | timing uncertainty estimate - i | hard-decoded output |
|---|---|---|---|---|---|
| 1 | 0 | 0 | 0 | 1 | $d_1$ |
| 2 | 0 | 0 | 1 | 1 | $d_1$ |
| 3 | 0 | 1 | 0 | If $d_0 = d_2$, then i = 0 or i = 2. If $d_0 \neq d_2$, then i = 1. | If $d_0 = d_2$, then output $d_0$. If $d_0 \neq d_2$, then output $d_1$. |
| 4 | 0 | 1 | 1 | 0 | $d_0$ |
| 5 | 1 | 0 | 0 | 1 | $d_1$ |
| 6 | 1 | 0 | 1 | 1 | $d_1$ |
| 7 | 1 | 1 | 0 | 2 | $d_2$ |
| 8 | 1 | 1 | 1 | 1 | $d_1$ |

The essence of Table 1 is to determine which sample timing index i to use based primarily on the ambiguity indicators $a_i(t)$, secondarily on the hard-decoded values $d_i(t)$ when the ambiguity indicators are inconclusive, and thirdly on the prior assumption that the middle sample i=1 is nominally correct (i.e. no bias in the sample timing error). The table can be interpreted as follows:

When two samples are ambiguous and one is unambiguous (i.e. rows 4, 6, and 7), simply choose the sample timing index i which was declared unambiguous.

When all three samples are unambiguous (i.e. row 1), choose the middle sample i=1. In this case, all three choices are highly probably to be correct, so choose the middle one by default.

When all three samples are ambiguous (i.e. row 8), choose the middle sample i=1. In this case, all three options are ambiguous, so default to the "conventional" choice of the middle sample.

When two adjacent samples are unambiguous and one sample is ambiguous (i.e. rows 2 and 5), choose the middle sample i=1. Because two adjacent samples are unambiguous, that implies that the either (i) the first and middle samples are unambiguous or (ii) the middle and last samples are unambiguous. In either case, the middle sample is unambiguous, so that one is chosen based on the prior assumption that there is no bias in the sample timing error.

When the first and last samples are unambiguous and the middle sample is ambiguous (i.e. row 3), use the hard-decoded values to aid in the decision. In particular, choose the middle sample if the hard-decoded values of the first and last samples contradict, and choose the outer samples if the hard-decoded values of the first and last samples are the same. When the outer two samples are unambiguous and have opposite hard-decoded values, we are likely near the symbol edge and thus the decision rule defaults to choosing the middle sample. When the outer two samples have the same hard-decoded value, then it is likely that the middle sample was simply perturbed by noise to push it into the ambiguity region, and thus, we can take either of the outer samples.

Using the determined sample timing, the decoded symbol output of the decoding device 403 is taken as the hard-decoded sample value for the chosen time index i.

Those skilled in the art recognize that other logic tables similar to Table 1 can be produced by using the GML principle. For instance, some of the outputs in Table 1 can be changed without significantly affecting the performance of the inventive decoding unit. For example, consider the following:

Row 1: All the outputs are unambiguous. Because the received signal is continuous in nature, it is highly probable that all three hard-decoded samples are of the same value, i.e. $d_0(t)=d_1(t)=d_2(t)$. Stated differently, it is unlikely that the signal would experience an extreme change in value where it skips over the ambiguity region from one sample to the next. Thus, the timing estimate i can be made as any one of the three possible values without significant decoder performance degradation.

Row 2: Using the same signal continuity argument as stated for row 1 above, one can choose the timing estimate to be either i=0 or i=1 without significant decoder performance degradation since it is likely that $d_0(t)=d_i(t)$.

Row 3 (Case where $d_0=d_2$): Since $d_0=d_2$, it i equivalent to output $d_2$ instead of $d_0$. Thus, this change can be made with no effect on decoder performance.

Row 5: Using the same signal continuity argument as stated for row 1 above, one can choose the timing estimate to be i=1 or i=2 without significant performance degradation since it is likely that $d_1(t)=d_2(t)$.

Any combination of these changes could be made to Table 1 to simplify the implementation of the decoding logic. These and similar modifications are considered to be included as part of the present invention.

Second Exemplary Embodiment

Figure 6:
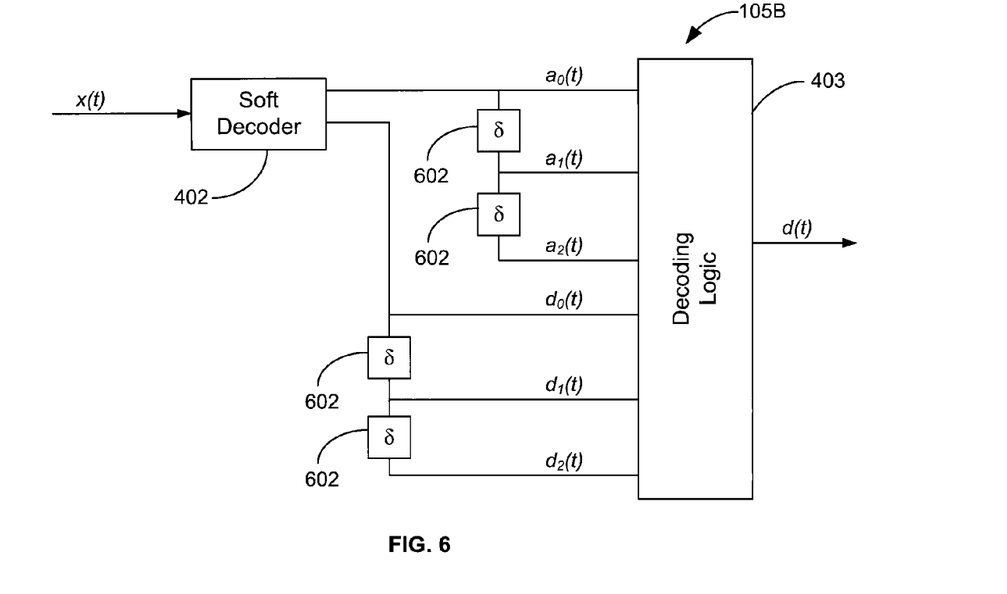
FIG. 6 is a block diagram of a deocoding unit that employs a single asynchronous soft-decoder according to one exemplary embodiment of the present invention.

Referring now to FIG. 6, it is sometimes advantageous to replace analog circuitry with functionally equivalent digital circuitry when possible. The primary reason for this replacement of analog processing is that while the functionality is theoretically the same in both situations, it is sometimes easier to maintain the signal integrity in the digital domain. Specifically, operations such as delays and splitting of the signal can distort the analog signal, thereby making a reliable implementation difficult in the analog domain. However, in the digital domain, the signal can be easily reshaped to remove minor distortions, and thereby implement the functionality with negligible degradation.

In FIG. 6, this digital embodiment of a decoding unit 105B is functionally equivalent to the exemplary embodiment illustrated in FIG. 4, but the exemplary embodiment of FIG. 6 reduces the amount of analog signal processing. Meanwhile, because of the functional equivalence of these two exemplary embodiments, the decoding logic given in Table 1 can be used for the exemplary embodiment of FIG. 6.

Compared to the exemplary embodiment of FIG. 4, the second exemplary embodiment of FIG. 6 has the three signal delays (and their associated signal splitting) transferred over to the digital domain. Thus, instead of producing soft-decoder outputs of three different delays of the signal x(t) as in the exemplary embodiment of FIG. 4, the exemplary embodiment of FIG. 6 applies a soft-decoder 402 directly to the received signal thereby avoiding any degradation of the received signal due to the analog splitting and delaying.

The soft-decoder outputs $a_0(t)$ and $d_0(t)$ are then split and delayed by digital delay elements 602 to yield the other soft-decoded samples $a_1(t)$, $a_2(t)$, $d_1(t)$, and $d_2(t)$. As previously mentioned, because the splitting and delays are in the digital domain, integrity of the signal can be more easily maintained in this second exemplary embodiment of FIG. 6 compared to the exemplary embodiment of FIG. 4 and thereby, the exemplary embodiment of FIG. 6 can be manufactured more easily in the presence of real-world circuit design challenges.

An additional advantage of the exemplary embodiment of FIG. 6 over the exemplary embodiment of FIG. 4 is that the former only requires a single soft-decoder 402 regardless of the number of signal delays desired whereas embodiment 105A in FIG. 4 requires a soft-decoder 402 for each sample taken during a symbol period. However, it should be noted that the soft-decoder 601 in the second decoding unit embodiment 105B in FIG. 6 is slightly different than the soft-decoder 402 in the first decoding unit embodiment 105A of FIG. 4. The two soft-decoders 402, 501 are identical except that the soft-decoder 602 of the second decoding unit embodiment 105B in FIG. 6 is asynchronous in operation. In other words, the comparator units 501A-501C and the logical AND-gate 504 in FIG. 5 are not driven by a clock but instead operate in a continuous manner.

Third Exemplary Embodiment

Although the first and second exemplary embodiments illustrated in FIGS. 4 and 6 are both presented with the primary target application being high-speed digital communications, they are equally applicable to lower-speed digital communications as well. However, in the lower-speed applications, there exist other ways of implementing the same functionality such as illustrated in FIG. 7.

Figure 7:
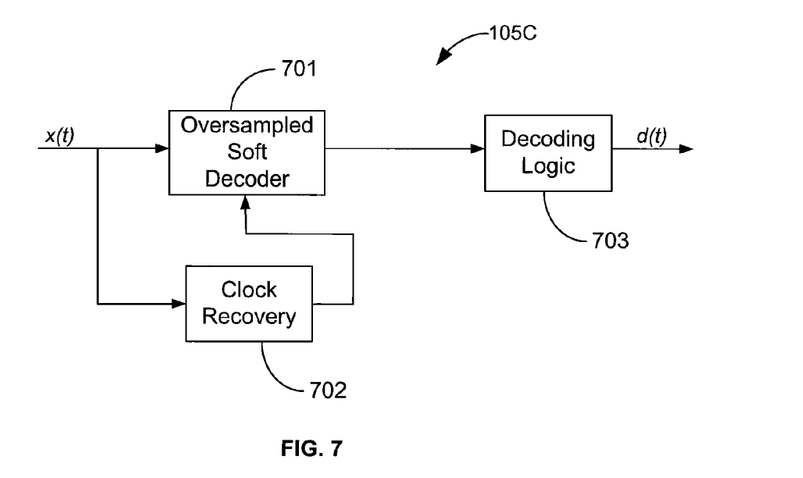
FIG. 7 is a block diagram of a decoding unit that employs a processor for lower data rate applications according to one exemplary embodiment of the present invention.

In particular, in FIG. 7, a third decoding unit 105C can comprise an oversampling analog-to-digital converter (ADC) 701 that can be used in place of the soft-decoders 402, 602 and associated delay elements (401, 402, and 602 for the exemplary embodiments of FIGS. 4 and 6). This ADC 701 may then feed these samples (either as a serial data stream at the oversampling data rate or a multiple of data streams at the symbol rate) to a microprocessor 703. The microprocessor 703 can be programmed to implement the decoding rule in Table 1 or one of its variants. Thus, the present invention can be realized at lower-speeds with readily available commercial components, such as the oversampling ADC 701, a clock recovery unit 702, and a programmable processor or logic device 703.

Exemplary Methods for Decoding Received Signals

The processes and operations described below with respect to all of the logic flow diagrams may include the manipulation of signals by a processor and the maintenance of these signals within data structures resident in one or more memory storage devices. For the purposes of this discussion, a process can be generally conceived to be a sequence of computer-executed steps leading to a desired result.

These steps usually require physical manipulations of physical quantities. Usually, though not necessarily, these quantities take the form of electrical, magnetic, or optical signals capable of being stored, transferred, combined, compared, or otherwise manipulated. It is convention for those skilled in the art to refer to representations of these signals as bits, bytes, words, information, elements, symbols, characters, numbers, points, data, entries, objects, images, files, or the like. It should be kept in mind, however, that these and similar terms are associated with appropriate physical quantities for computer operations, and that these terms are merely conventional labels applied to physical quantities that exist within and during operation of the computer.

It should also be understood that manipulations within the computer are often referred to in terms such as creating; adding, calculating, comparing, moving, receiving, determining, identifying, populating, loading, executing, etc. that are often associated with manual operations performed by a human operator. The operations described herein can be machine operations performed in conjunction with various input provided by a human operator or user that interacts with the computer.

In addition, it should be understood that the programs, processes, methods, etc. described herein are not related or limited to any particular computer or apparatus. Rather, various types of general purpose machines may be used with the following process in accordance with the teachings described herein.

The present invention may comprise a computer program or hardware or a combination thereof which embodies the functions described herein and illustrated in the appended flow charts. However, it should be apparent that there could be many different ways of implementing the invention in computer programming or hardware design, and the invention should not be construed as limited to any one set of computer program instructions.

Further, a skilled programmer would be able to write such a computer program or identify the appropriate hardware circuits to implement the disclosed invention without difficulty based on the flow charts and associated description in the application text, for example. Therefore, disclosure of a particular set of program code instructions or detailed hardware devices is not considered necessary for an adequate understanding of how to make and use the invention. The inventive functionality of the claimed computer implemented processes will be explained in more detail in the following description in conjunction with the remaining Figures illustrating other process flows.

Certain steps in the processes or process flow described in all of the logic flow diagrams below must naturally precede others for the present invention to function as described. However, the present invention is not limited to the order of the steps described if such order or sequence does not alter the functionality of the present invention. That is, it is recognized that some steps may be performed before, after, or in parallel other steps without departing from the scope and spirit of the present invention.

Method for Decoding Received Signals—First Exemplary Embodiment

Figures 8, 9:
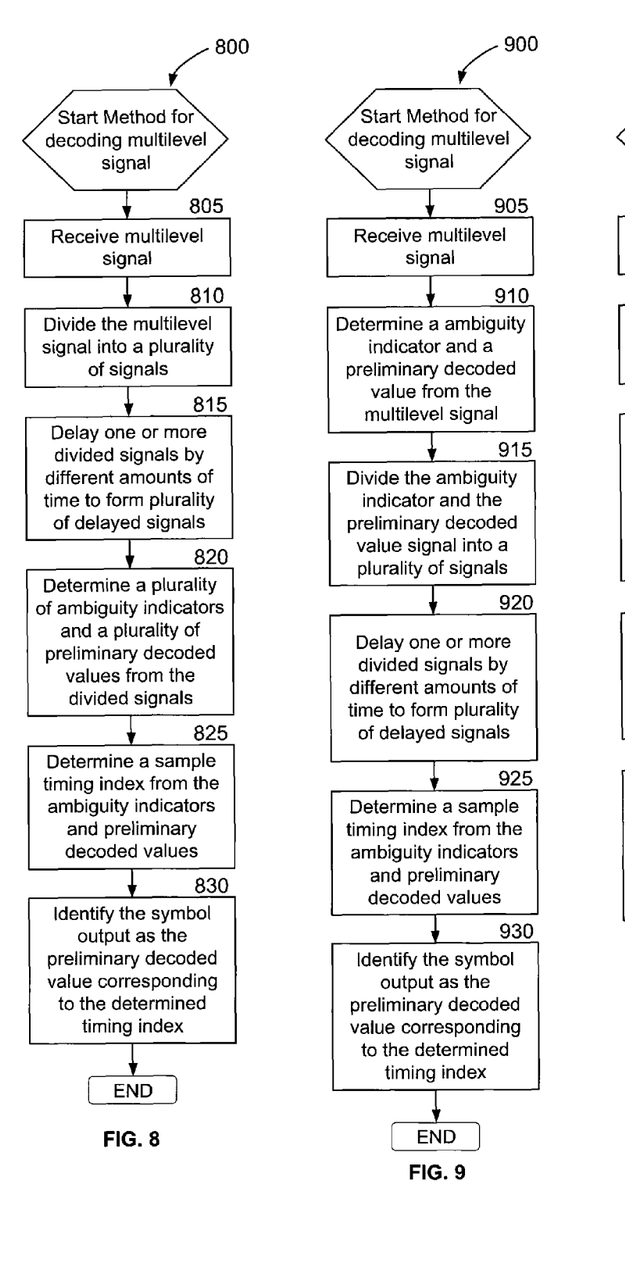
FIG. 8 is a logic flow diagram illustrating an exemplary method for decoding a received signal according to the first exemplary embodiment of the present invention illustrated in FIG. 4.
FIG. 9 is a logic flow diagram illustrating an exemplary method for decoding a received signal according to the second exemplary embodiment of the present invention illustrated in FIG. 6.

Referring now to FIG. 8, this figure is a logic flow diagram illustrating an exemplary method 800 for decoding received signals according to a first exemplary embodiment of the present invention as illustrated in FIG. 4.

The steps of method 800 generally correspond with the decoding unit 105A illustrated in FIG. 4. Step 805 is the first step of method 800 in which a communicated signal such as the signal 200 illustrated in FIG. 2 can be received. Next, in step 810 the received signal is divided into a plurality of equivalent signals.

In step 815, the one or more divided signals are each delayed by a different amount of time. Step 815 generally corresponds to the delay stages or elements 401 of FIG. 4.

In step 820, a plurality of ambiguity indicators and preliminary decoded values corresponding to the divided signals are determined. Step 820 generally corresponds to the digital outputs of the soft-decoders 402 of FIG. 4. The ambiguity indicator corresponds to signal $a_i(t)$ while the preliminary decoded value corresponds to signal $d_i(t)$. As noted above, signal $a_i(t)$ is an ambiguity indicator signifying the degree of confidence that the soft-decoder 402 has in its decision $d_i(t)$. In other words, the signal $a_i(t)$ conveys how likely $d_i(t)$ correctly represents the current symbol.

In step 825, a sample timing index is determined from the ambiguity indicators and preliminary decoded values. This step generally corresponds with Table 1 and how the sample timing index i is derived from the ambiguity indicators and their relationships to one another along with the preliminary decoded values. In step 830, the symbol output corresponding to the determined index and preliminary decoded value is identified. This step generally corresponds with Table 1 and the last column of values that are used based on the determined sample timing index i.

Method for Decoding Received Signals—Second Exemplary Embodiment

Referring now to FIG. 9, this figure is a logic flow diagram illustrating an exemplary method 900 for decoding received signals according to a second exemplary embodiment of the present invention as illustrated in FIG. 6.

The steps of method 900 generally correspond with the decoding unit 105B illustrated in FIG. 6. Step 905 is the first step of method 900 in which a communicated signal such as the signal 200 illustrated in FIG. 2 can be received. Next, in step 910, an ambiguity indicator and a preliminary decoded value corresponding to the received signal are determined.

Step 910 generally corresponds to the digital outputs of the single, asynchronous soft-decoder 402 of FIG. 6. The ambiguity indicator corresponds to signal $a_i(t)$ while the preliminary decoded value corresponds to signal $d_i(t)$. As noted above, signal $a_i(t)$ is an ambiguity indicator signifying the level of confidence that the soft-decoder 402 has in its decision $d_i(t)$. In other words, the signal $a_i(t)$ conveys how likely $d_i(t)$ correctly represents the current symbol.

In step 915, the ambiguity indicator signal and decoded value are divided into a plurality of signals. Next, in step 920, the one or more divided signals are each delayed by a different amount of time. Step 920 generally corresponds to the delay stages or digital delay elements 602 of FIG. 6.

In step 925, a sample timing index is determined from the delayed ambiguity indicators and the associated preliminary decoded values. This step generally corresponds with Table 1 and how the sample timing index i is derived from the ambiguity indicators and their relationships to one another along with the preliminary decoded values. In step 930, the symbol output is the preliminary decoded value corresponding to the determined index. This step generally corresponds with Table 1 and the last column of values that are used based on the determined sample timing index i.

Method for Decoding Received Signals—Third Exemplary Embodiment

Figure 10:
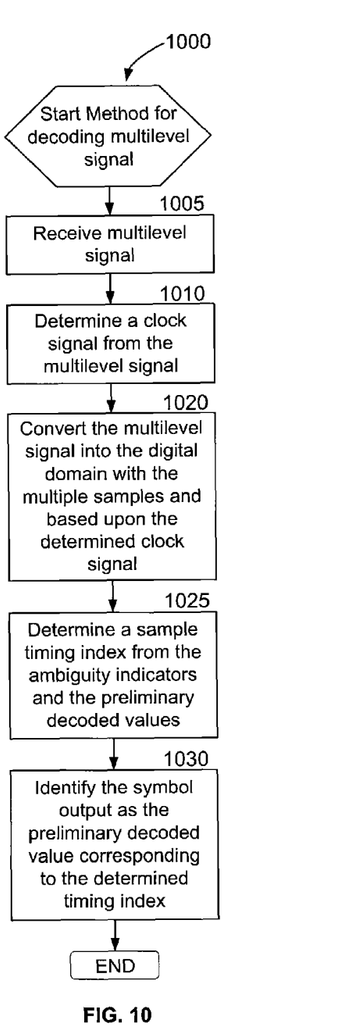
FIG. 10 is a logic flow diagram illustrating an exemplary method for decoding a received signal according to the third exemplary embodiment of the present invention illustrated in FIG. 7.

Referring now to FIG. 10, this figure is a logic flow diagram illustrating an exemplary method 1000 for decoding received signals according to a third exemplary embodiment of the present invention as illustrated in FIG. 7.

The steps of method 1000 generally correspond with the decoding unit 105C illustrated in FIG. 7. Step 1005 is the first step of method 1000 in which a communicated signal such as the signal 200 illustrated in FIG. 2 can be received. Next, in step 1010, a clock signal is determined from the received signal. Step 1010 generally corresponds with the clock recovery unit 702 of FIG. 7.

In step 1020, the received signal is converted into the digital domain by taking multiple samples based upon the determined clock signal. Step 1020 generally corresponds with the oversampled soft-decoder or ADC 701 as illustrated in FIG. 7.

In step 1025, a sample timing index is determined from delayed ambiguity indicators and the associated preliminary decoded values. This step generally corresponds with Table 1 stored in the microprocessor 703 of FIG. 7 and how the sample timing index i is derived by the processor from the ambiguity indicators and their relationships to one another along with the preliminary decoded values. In step 1030, the symbol output is the preliminary decoded value corresponding to the determined index. This step generally corresponds with Table 1 and the last column of values that are used based on the determined sample timing index i.

It should be understood that the foregoing relates only to illustrate the embodiments of the present invention, and that numerous changes may be made therein without departing from the scope and spirit of the invention as defined by the following claims.

What is claimed is:

1. A communication system, comprising:
    a receiver comprising an input configured to receive a signal; and
    a plurality of soft-decoders, each soft-decoder operable to sample the received signal at a different time within a symbol period and to output two values for each sample, the first value comprising a preliminary decoded value and the second value comprising an ambiguity indicator; and
    a logic device coupled to the each of the soft-decoders, operable to determine a decoded value for each symbol based on one or more preliminary decoded values and ambiguity indicators.

2. The communication system of claim 1, wherein the soft-decoders are substantially identical to one another.

3. The communication system of claim 1, wherein each soft-decoder comprises:
    a first comparator with inputs comprising the received signal and a first reference voltage;
    a second comparator with inputs comprising the received signal and a second reference voltage; and
    a third comparator with inputs comprising the received signal and a third reference voltage.

4. The communication system of claim 1, wherein each soft-decoder comprises a plurality of comparators and one or more logical AND gates.

5. The communication system of claim 1, further comprising a plurality of delay elements coupled to the soft-decoders.

6. The communication system of claim 1, further comprising a plurality of delay elements coupled to the soft-decoders, each delay element delaying the received signal by a different amount.

7. The communication system of claim 1, further comprising a plurality of delay elements coupled to the soft-decoders, each delay element delaying a clock signal by a different amount.

8. The communication system of claim 1, wherein the logic device determines the decoded value for each symbol using generalized maximum likelihood estimation with the one or more preliminary decoded values and ambiguity indicators.

9. The communication system of claim 1, wherein the received signal comprises a multi-level signal.

10. A communication system, comprising:
    a transmitter that is operable to transmit a multi-level signal;
    a receiver for receiving the multi-level signal over a communication path extending between the receiver and the transmitter, the receiver comprising:
        an asynchronous soft-decoder that is operable to continuously sample the multi-level signal and produce a decoded output signal and an ambiguous indicator signal;
        a plurality of first delay elements coupled to a first soft-decoder, each first delay element operable to generate a different delay relative to another first delay element and to produce an ambiguity indicator from the ambiguous indicator signal;
        a plurality of second delay elements coupled to a second soft-decoder output, each second delay element operable to generate a different delay relative to another second delay element and to produce a preliminary decoded output from the decoded output signal; and
        a logic device coupled to the each of the first and second delay elements, for determining a decoded value based on one or more of the preliminary decoded outputs and ambiguity indicators.

11. The communication system of claim 10, wherein the soft-decoder comprises:
    a first comparator with inputs comprising the multi-level signal and a first reference voltage;
    a second comparator with inputs comprising the multi-level signal and a second reference voltage; and
    a third comparator with inputs comprising the multi-level signal and a third reference voltage.

12. The communication system of claim 10, wherein the soft-decoder comprises a plurality of comparators and one or more logical AND gates.

13. The communication system of claim 10, wherein the logic device determines the decoded value for each symbol using generalized maximum likelihood estimation with the one or more preliminary decoded values and ambiguity indicators.

14. A signal receiver, comprising:
    an input for receiving a signal;
    an analog-to-digital converter for sampling the received signal faster than once every symbol period of the received signal and outputting for each sample a first value comprising a preliminary decoded value and a second value comprising an ambiguity indicator;
    a processor coupled to the converter and operable to:
        group a subset of sampled first and second values derived from the single symbol period;
        examine the subset of sampled first and second values; and
        determine a first value closest to an optimum sampling time based on a principle of generalized maximum likelihood, for decoding the first value closest to the optimum sampling time and outputting that decoded first value as the decoded symbol.

15. The signal receiver of claim 14, further comprising a clock recovery unit coupled to the converter for providing a clock signal.

16. The signal receiver of claim 14, wherein the processor calculates the first value closest to the optimum sampling time by:
   computing an absolute difference between each first value and a nearest level corresponding to a decoded symbol;
   finding a first value which has a smallest absolute difference from the subset of first values; and
   taking the first value with the smallest absolute difference as the first value closest to the optimum sampling time.

17. A communication system, comprising:
   a receiver comprising an input for receiving a signal; and
   a decoding unit that estimates a timing offset for the received signal on a symbol-by-symbol basis and decodes the received signal using generalized maximum likelihood estimation with the estimated timing offset, the decoding unit comprising:
      a signal splitting element that divides the received signal into a plurality of received signals; and
      a plurality of delay elements that each delay one of the plurality of received signals, wherein each delay element applies a different time delay than each other delay element.

18. The communication system of claim 17, wherein the decoding unit decodes the received signal using generalized maximum likelihood estimation by identifying a symbol that corresponds to a selected timing index.

19. The communication system of claim 17, wherein the received signal comprises a multi-level signal.

20. The communication system of claim 17, wherein the decoding unit further comprises a plurality of soft-decoders, each soft-decoder coupled to a respective delay element, and wherein each soft decoder samples the received signal at a different time within a symbol period and outputs two values for each sample, the first value comprising a preliminary decoded value and the second value comprising an ambiguity indicator.

21. The communication system of claim 20, wherein the soft-decoders are substantially identical to one another.

22. The communication system of claim 20, wherein each soft-decoder comprises:
   a first comparator with inputs comprising the received signal and a first reference voltage;
   a second comparator with inputs comprising the received signal and a second reference voltage; and
   a third comparator with inputs comprising the received signal and a third reference voltage.

23. The communication system of claim 20, wherein each soft-decoder comprises a plurality of comparators and one or more logical AND gates.

* * * * *